(12) United States Patent
Divsalar et al.

(10) Patent No.: US 7,499,490 B2
(45) Date of Patent: Mar. 3, 2009

(54) ENCODERS FOR BLOCK-CIRCULANT LDPC CODES

(75) Inventors: Dariush Divsalar, Pacific Palisades, CA (US); Aliazam Abbasfar, Cupertino, CA (US); Christopher R. Jones, Pacific Palisades, CA (US); Samuel J. Dolinar, Sunland, CA (US); Jeremy C. Thorpe, Redlands, CA (US); Kenneth S. Andrews, Pasadena, CA (US); Kung Yao, Sherman Oaks, CA (US)

(73) Assignees: California Institute of Technology, Pasadena, CA (US); The Regents of the University of California, Oakland, CA (US)

( * ) Notice: Subject to any disclaimer, the term of this patent is extended or adjusted under 35 U.S.C. 154(b) by 729 days.

(21) Appl. No.: 11/166,041

(22) Filed: Jun. 24, 2005

(65) Prior Publication Data
US 2006/0291571 A1    Dec. 28, 2006

(51) Int. Cl.
*H04B 1/66* (2006.01)
(52) U.S. Cl. .................. 375/240; 375/254; 375/271; 375/302; 341/51; 341/74; 714/758; 714/800
(58) Field of Classification Search .............. None
See application file for complete search history.

(56) References Cited

U.S. PATENT DOCUMENTS

| | | | |
|---|---|---|---|
| 3,542,756 A | 11/1970 | Gallager | |
| 3,655,396 A | 4/1972 | Goto et al. | |
| 4,295,218 A | 10/1981 | Tanner | |
| 5,023,889 A | 6/1991 | Divsalar et al. | |
| 5,729,560 A | 3/1998 | Hagenauer et al. | |
| 5,734,962 A | 3/1998 | Hladik et al. | |
| 6,014,411 A | 1/2000 | Wang | |
| 6,023,783 A | 2/2000 | Divsalar et al. | |
| 6,473,010 B1 | 10/2002 | Vityaev et al. | |
| 6,518,892 B2 | 2/2003 | Shen et al. | |
| 6,539,367 B1 | 3/2003 | Blanksby et al. | |
| 6,560,362 B1 | 5/2003 | Piret et al. | |
| 6,567,465 B2 | 5/2003 | Goldstein et al. | |
| 6,633,856 B2 | 10/2003 | Richardson et al. | |
| 6,686,853 B2 | 2/2004 | Shen et al. | |
| 6,715,121 B1 | 3/2004 | Laurent | |
| 6,718,502 B1 | 4/2004 | Kuznetsov et al. | |
| 6,724,327 B1 | 4/2004 | Pope et al. | |
| 6,757,122 B1 | 6/2004 | Kuznetsov et al. | |
| 6,769,091 B2 | 7/2004 | Classon et al. | |
| 6,771,197 B1 | 8/2004 | Yedidia et al. | |

(Continued)

OTHER PUBLICATIONS

Yu Kou et al., "On Circulant Low Density Parity Check Codes", IEEE International Symposium on Information Theory, Jun. 30-Jul. 5, p. 200, 2002.

(Continued)

*Primary Examiner*—Dac V Ha
(74) *Attorney, Agent, or Firm*—Steinfl & Bruno (57) ABSTRACT

Methods and apparatus to encode message input symbols in accordance with an accumulate-repeat-accumulate code with repetition three or four are disclosed. Block circulant matrices are used. A first method and apparatus make use of the block-circulant structure of the parity check matrix. A second method and apparatus use block-circulant generator matrices.

28 Claims, 6 Drawing Sheets

U.S. PATENT DOCUMENTS

| | | | |
|---|---|---|---|
| 6,785,863 B2 | 8/2004 | Blankenship et al. | |
| 6,789,227 B2 | 9/2004 | De Souza et al. | |
| 6,803,787 B1 | 10/2004 | Wicker, Jr. | |
| 6,829,308 B2 | 12/2004 | Eroz et al. | |
| 6,842,872 B2 | 1/2005 | Yedida et al. | |
| 6,848,069 B1 | 1/2005 | Levy et al. | |
| 6,857,097 B2 | 2/2005 | Yedidia et al. | |
| 6,862,552 B2 | 3/2005 | Goldstein et al. | |
| 6,888,897 B1 | 5/2005 | Nazari et al. | |
| 6,903,665 B2 | 6/2005 | Akhter et al. | |
| 7,089,477 B1 | 8/2006 | Divsalar et al. | |
| 7,093,179 B2 | 8/2006 | Shea | |
| 7,095,792 B2 | 8/2006 | Doetsch et al. | |
| 7,158,589 B2 | 1/2007 | Cameron et al. | |
| 7,191,376 B2 | 3/2007 | Yedidia | |
| 7,243,294 B1 | 7/2007 | Divsalar et al. | |
| 7,313,752 B2 * | 12/2007 | Kyung et al. | 714/801 |
| 7,343,539 B2 | 3/2008 | Divsalar et al. | |
| 2005/0149845 A1 * | 7/2005 | Shi et al. | |
| 2005/0223305 A1 * | 10/2005 | Kons | |
| 2007/0011568 A1 * | 1/2007 | Hocevar | |

OTHER PUBLICATIONS

S. Lin, "Quasi-Cyclic LDPC Codes" CCSDS working group white paper, Oct. 2003.

R.M. Tanner, "On Graph Constructions for LDPC Codes by Quasi-Cyclic Extension," in Information, Coding and Mathematics (M. Blaum, P. Farrell, and H. van Tilborg, eds.) pp. 209-220, Kluwer, Jun. 2002.

A Sridharan, et al., "A Construction for Low Density Parity Check Convolutional Codes Based on Quasi-Cyclic Block Codes", in IEEE International Symposium on Information Theory p. 481, Jun. 30-Jul. 5, 2002.

O. Milenkovic, "Block-Circulant Low-Density Parity-Check Codes for Optical Communication System" IEEE Journal of Selected Topics in Quantum Electronics, pp. 294-299, Mar. 2004.

J. Thorpe et al. "Methodologies for Designing LDPC Codes Using Photographs and Circulants," in IEEE International Symposium on Information Theory, p. 238, Jun. 27-Jul. 2, 2004.

Aliazam Abbasfar et al. "Accumulate Repeat Accumulate Coded Modulation" IEEE Military Communications Coference, Oct. 31-Nov. 3, 2004.

Aliazam Abbasfar et al. "Accumulate Repeat Accumulate Codes" IEEE Globecom 2004, Nov. 29-Dec. 3, 2004.

Aliazam Abbasfar et al., "Maximum Likelihood Decoding Analysis of Accumulate-repeat-Accumulate Codes" IEEE Globecom 2004, Nov. 29-Dec. 3, 2004.

* cited by examiner

ENCODERS FOR BLOCK-CIRCULANT LDPC CODES

GOVERNMENT INTEREST

The invention described herein was made in the performance of work under a NASA contract, and is subject to the provisions of Public Law 96-517 (35 USC 202) in which the Contractor has elected to retain title.

CROSS-REFERENCE TO RELATED APPLICATIONS

This application is filed on the same day of U.S. Pat. App. Ser. No. 11,166,040, now U.S. Pat. No. 7,343,539, for "ARA Type Protograph Codes", incorporated herein by reference in its entirety.

BACKGROUND

1. Field

The present disclosure relates to encoders and encoding methods for block-circulant low-density parity-check (LDPC) codes. In particular, a first encoder and iterative encoding method are based on the erasure decoding algorithm. The computations required are well organized due to the block-circulant structure of the parity check matrix. A second encoder and method use block-circulant generator matrices. Some encoders of the second type have been implemented in a small Field Programmable Gate Array (FPGA) and can operate at 100 Msymbols/second.

2. Related Art

Recently, block-circulant LDPC codes have been found that provide both excellent error correction performance and well structured decoder architectures. Constructions have been presented in the following papers:.

Y. Kou, H. Tang, S. Lin, and K. Abdel-Ghaffar, "On Circulant Low Density Parity Check Codes," IEEE International Symposium on Information Theory, p. 200, June 2002;

S. Lin, "Quasi-Cyclic LDPC Codes." CCSDS working group white paper, Oct. 2003;

R. M. Tanner, "On Graph Constructions for LDPC Codes by Quasi- Cyclic Extension," in Information, Coding and Mathematics (M. Blaum, P. Farrell, and H. van Tilborg, eds.), pp. 209-220, Kluwer, June 2002;

A. Sridharan, D. Costello, and R. M. Tanner, "A Construction for Low Density Parity Check Convolutional Codes Based on Quasi-Cyclic Block Codes," in IEEE International Symposium on Information Theory, p. 481, June 2002;

O. Milenkovic, I. Djordjevic, and B. Vasic, "Block-Circulant Low-Density Parity-Check Codes for Optical Communication Systems," IEEE Journal of Selected Topics in Quantum Electronics, pp. 294-299, March 2004;

J. Thorpe, K. Andrews, and S. Dolinar, "Methodologies for Designing LDPC Codes Using Protographs and Circulants," in IEEE International Symposium on Information Theory, p. 238, June 2004), and others.

All of the above papers are incorporated herein by reference in their entirety.

Error correcting codes are used to transmit information reliably over an unreliable channel, such as a radio communications link or a magnetic recording system. One class of error correcting codes are binary block codes, where K information bits are encoded into a codeword of N symbols (N>K), the codeword is transmitted over the channel, and a decoder then attempts to decode the received (and potentially corrupted) symbols into the original K information bits. If the channel symbols are also binary, an encoder that uses the K information bits as K of the. N channel symbols is known as a systematic encoder. These K channel symbols are called the systematic symbols, and the remaining N−K symbols are called parity symbols. Sometimes one uses an encoder that generates N+P symbols, and then P of them are discarded while the remaining N are transmitted over the channel. The discarded symbols are known as punctured symbols.

Many different mathematical models are used to describe physical communications channels. One model is the Binary Erasure Channel (BEC). The input alphabet is binary (either 0 or 1), and the output alphabet is ternary (0, 1, or e for erasure). When a 0 is transmitted over the BEC, the received symbol may be either 0 or e; similarly, a transmitted 1 is received either as a 1 or e. An erasure correcting decoder is used with a BEC, and its task is to reconstruct the binary values that were transmitted and corrupted to the value e by the channel. In particular, puncturing a codeword is equivalent to transmitting it over a BEC, where each punctured symbol is corrupted to the value e.

Erasure correcting decoders for LDPC codes have been studied at length [see, for example, M. Luby, M. Mitzenmacher, A. Shokrollahi, D. Spielman, and V. Stemann, "Practical loss-resilient codes," in Proc. 29th Annual ACM Symp. Theory of Computing, 1997, pp. 150-159], and the decoding method described in that paper has become the standard erasure correcting algorithm. This erasure correcting algorithm succeeds if and only if the erased symbol positions do not contain a stopping set [see T. Richardson and R. Urbanke, "Efficient Encoding of Low-Density Parity-Check Codes, IEE Trans. on Information Theory, February 2001, pp. 638-656].

U.S. Pub. App. No. 20040153934 discloses a method and apparatus for encoding LDPC codes.

SUMMARY

In accordance with the present disclosure, novel encoders, encoding methods and a hardware encoder implementation for block-circulant LDPC codes will be presented.

According to a first aspect, an encoding apparatus to encode message input symbols in accordance with an accumulate-repeat-accumulate code with repetition four is disclosed, the apparatus comprising: a first multiplier to multiply a first portion of the input symbols with a first matrix, forming first intermediate symbols; a second multiplier to multiply a second portion of the input symbols with a second matrix, forming second intermediate symbols; a first adder to sum the first intermediate symbols with the second intermediate symbols, forming third intermediate symbols; a third multiplier to multiply the third intermediate symbols with a third matrix, forming fourth intermediate symbols; a fourth multiplier to multiply the third intermediate symbols with a fourth matrix, forming a first set of output symbols; a second adder to sum the fourth intermediate symbols with the second portion of the input symbols, forming fifth intermediate symbols; a permuter to permute the fifth intermediate symbols, forming permuted symbols; and an accumulator to accumulate the permuted symbols, forming a second set of output symbols.

According to a second aspect, a method for encoding message input symbols in accordance with an accumulate-repeat-accumulate code with repetition four is disclosed, comprising: multiplying a first portion of the input symbols with a first matrix, forming first intermediate symbols; multiplying a second portion of the input symbols with a second matrix, forming second intermediate symbols; adding the first intermediate symbols to the second intermediate symbols, forming third intermediate symbols; multiplying the third intermediate symbols with a third matrix, forming fourth intermediate symbols; multiplying the third intermediate symbols with a fourth matrix, forming a first set of output symbols; adding the fourth intermediate symbols with the input symbols, forming fifth intermediate symbols; permuting the fifth intermediate symbols, forming permuted symbols; and accumulating the permuted symbols, forming a second set of output symbols.

According to a third aspect, an encoding apparatus to encode message input symbols in accordance with an accumulate-repeat-accumulate code with repetition three is disclosed, the apparatus comprising: a puncturing device, puncturing k input symbols and outputting k/2 input symbols, forming a first set of output symbols; a first multiplier to multiply the k input symbols with a first matrix, forming first intermediate symbols; a second multiplier to multiply the k input symbols with a second matrix, forming a second set of output symbols; a permuter to permute the first intermediate symbols, forming permuted symbols; and an accumulator to accumulate the permuted symbols, forming a third set of output symbols.

According to a fourth aspect, a method for encoding message input symbols in accordance with an accumulate-repeat-accumulate code with repetition three is disclosed, comprising: puncturing k input symbols and outputting k/2 input symbols, forming a first set of output symbols; multiplying the k input symbols with a first matrix, forming first intermediate symbols; multiplying the k input symbols with a second matrix, forming a second set of output symbols; permuting the first intermediate symbols, forming permuted symbols; and accumulating the permuted symbols, forming a third set of output symbols.

According to a fifth aspect, an encoding apparatus to encode input symbols in accordance with a block-circulant LDPC code is disclosed, the apparatus comprising: a plurality of recursive convolutional encoders, each recursive convolutional encoder comprising storage units, multipliers and adders to encode the input symbols; and a plurality of circulant patterns to be fed to the recursive convolutional encoders, one set of patterns for each recursive convolutional encoder.

According to a sixth aspect, a method for encoding input symbols in accordance with a block-circulant LDPC code is disclosed, comprising: providing a plurality of recursive convolutional encoders, each recursive convolutional encoder comprising storage units, multipliers and adders; setting the storage units to a first binary value; repeating the following operations: i) computing a set of circulant patterns, ii) providing each recursive convolutional encoder with a binary sequence of T message bits, each message bit sent to the output as a codeword symbol, and each message bit being multiplied with a circulant pattern, summed to the result of a previous multiplication, stored in a storage unit and shifted, until the T message bits have been encoded, until kT message bits have been encoded; and generating an output codeword by reading the contents of the storage units of the recursive convolutional encoders.

DETAILED DESCRIPTION

1. Introduction

In this section, AR3A and AR4A codes will be introduced, protographs for the AR3A and AR4A codes will be shown, and block-circulant parity check matrixes for the AR3A and AR4A codes will be described.

Throughout the present description, a circulant will be defined as a square binary matrix where each row is constructed from the previous row by a single right cyclic shift. It will not be required that each row has Hamming weight 1.

An rT×nT parity check matrix H can be constructed by concatenating r×n sparse circulants of size T×T. The density of each circulant matrix is indicated by the corresponding value in an r×n base matrix $H_{base}$.

The Tanner graph corresponding to this matrix is called a protograph (see J. Thorpe, "Low-Density Parity-Check (LDPC) Codes Constructed from Protographs," IPN Progress Report 42-154, JPL, August 2003). See also the "Related Art" section of U.S. patent application Ser. No. 11/166,040 for "ARA Type Protograph Codes", incorporated herein by reference in its entirety. Entries greater than 1 in the base matrix correspond to multiple edges in the protograph. Base matrices can be expanded into block-circulant LDPC codes by replacing each entry in $H_{base}$, with a circulant containing rows of the specified Hamming weight. The resulting codes are quasicyclic. Alternatively, they can be expanded into less structured codes by replacing each entry with a sum of arbitrary permutation matrices.

Figure 1:
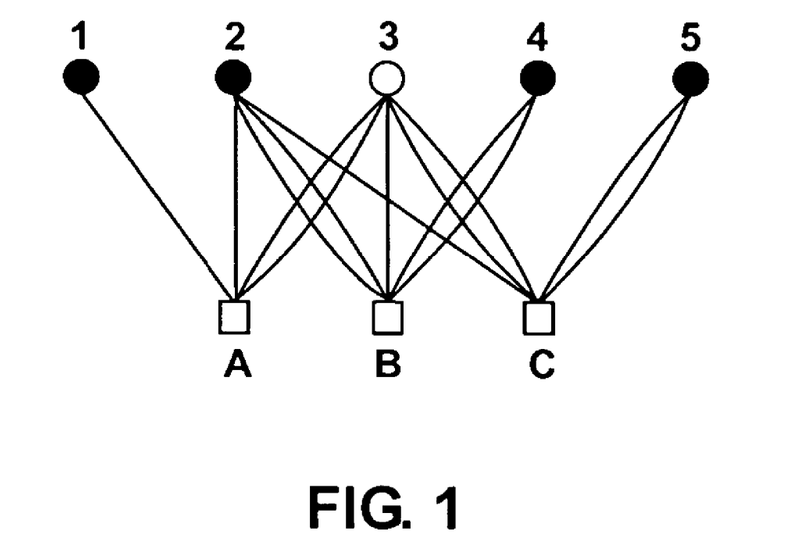
FIG. 1 shows a protograph for an AR3A code.
Figure 2:
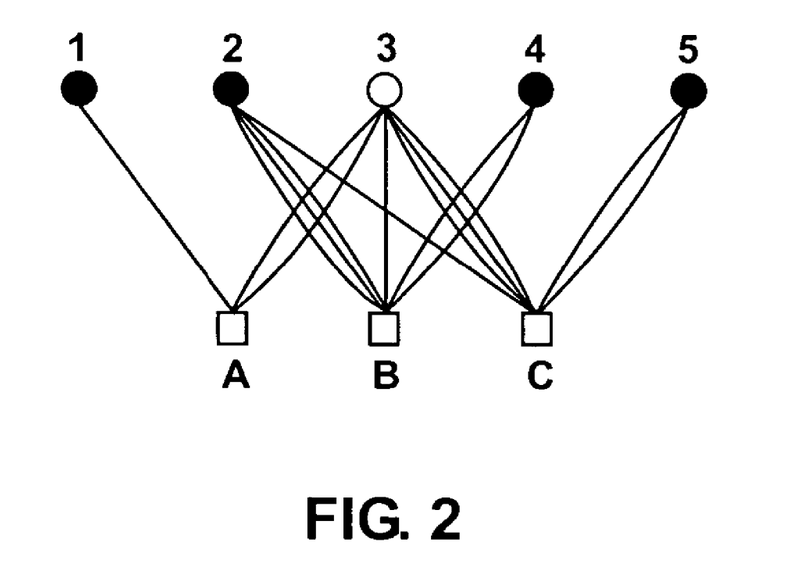
FIG. 2 shows a protograph for an AR4A code.

AR3A and AR4A codes are described in the applicant's patent application Ser. No. 11/166,040 for "ARA Type Protograph Codes", filed on the same day of the present application and incorporated herein by reference in its entirety. FIGS. 1 and 2 of the present application show protographs for AR3A and AR4A codes and will be used as examples throughout the present description. Squares represent parity check nodes and circles represent variable nodes, where the black circles represent transmitted symbols and the white circles represent punctured symbols. The designs of FIGS. 1 and 2 are derived from a three step encoding procedure: accumulate, repeat-by-3 (or 4), and accumulate shown by the Applicants in A. Abbasfar, D. Divsalar, and K. Yao, "Accumulate Repeat Accumulate Codes," IEEE International Symposium on Information Theory, (Chicago, Ill.), June 2004, and U.S. patent application Ser. No. 11/166,040 for "ARA Type Protograph Codes", both incorporated herein by reference in their entirety. Each protograph describes a 3×5 block-circulant parity check matrix, and the number of parallel edges shows the degree of the corresponding circulant.

In practice, these protographs cannot be directly expanded into block-circulant codes without introducing low weight codewords, regardless of the choice of circulants. A practical solution is to expand the protographs twice, first with small permutation matrices, such as of size 4×4 or 8×8, and then with circulants to build the full code. The result is a parity check matrix such as the one shown in FIG. 3 for a very small AR4A code, where each nonzero entry in the matrix is represented by a dot. This code was constructed by putting the AR4A protograph variable nodes in the order (4, 2, 1, 5, 3) and check nodes in order (A, B, C) as demarcated by the solid lines, expanding with 4×4 permutations, and then expanding with 16×16 circulants. The resulting 12×20 block-circulant structure is emphasized by dotted lines.

2. Iterative Encoders

A description of a general method for LDPC encoding can be found in T. Richardson and R. Urbanke, "Efficient Encoding of Low-Density Parity-Check Codes," IEEE Transactions on Information Theory, pp. 638-656, February 2001, incorporated herein by reference in its entirety. The present section will describe a related encoding technique, called iterative encoding, that also take advantage of the block-circulant structure of the parity check matrix.

An encoder for any (N,K) LDPC code can be built from an erasure correcting decoder.

In accordance with the present disclosure, a set of K linearly independent variable nodes are selected as the systematic symbols, and these are initialized with the K information bits to be encoded. If there are no stopping sets, then the remaining N−K parity symbols are computed iteratively with the standard erasure correcting algorithm. Because the erased symbol positions are known a priori, the existence of stopping sets is also known. This method is equivalent to Richardson and Urbanke's low-complexity encoding algorithm when their variable g=0. However, differently from what shown in Richardson-Urbanke, the method according to the present disclosure is applied to block-circulant codes.

If H has full rank R=N−K, and this iterative encoding method succeeds, then each of the N−K parity check equations is solved exactly once to determine one of the N−K unknown parity symbols. For a check equation with d terms, d−2 exclusive-OR operations are required. Thus, iterative encoding requires exactly E−2R exclusive-OR operations, where E is the number of nonzero elements in H. For an arbitrary LDPC code, the scheduling of these computations can be complex; for block-circulant codes, they can be performed in well organized groups of T operations. The amount of memory required in such an encoder varies depending on the code structure; it is sufficient to store all N code symbols.

The above process will be illustrated with the AR3A and AR4A code examples. AR3A and AR4A codes are accumulate-repeat-accumulate codes with repetition 3 and 4, respectively, as described in Applicants' patent application Ser. No. 11/166,040 for "ARA Type Protograph Codes", filed on the same day of the present application and incorporated herein by reference in its entirety 2A. Iterative Encoder for AR4A Code When the rows and columns of the AR4A base matrix are reordered as (B, A, C) and (4, 2, 3, 1, 5), the following structure of the parity check matrix H is obtained:

$$H = \begin{bmatrix} 2 & 3 & 1 & 0 & 0 \\ 0 & 0 & 2 & 1 & 0 \\ 0 & 1 & 3 & 0 & 2 \end{bmatrix}$$

Iterative encoding begins by applying the kT=2T information symbols to the first two columns in the base matrix. The first row of T check equations can be solved in parallel to determine the third column of code symbols, and then the next row can be solved to determine the fourth column. The 2 in the lower right corner means that each remaining check equation has two unknowns, and iterative encoding is halted by this stopping set. However, note that this parity check matrix is not full rank: the sum of the first T and last T rows of H is the all-zero vector, independent of the circulants chosen. This means that one of the remaining T undetermined code symbols can be assigned an additional information bit, and iterative encoding now completes successfully, operating (in a permuted order) as an accumulator of length T.

Figure 4:
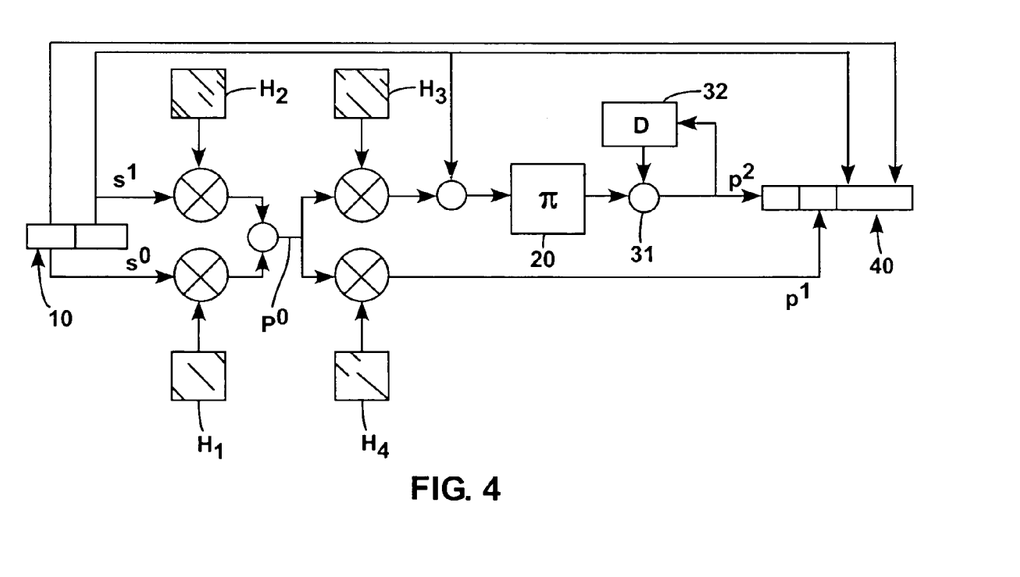
FIG. 4 shows a block diagram of an AR4A encoder.

FIG. 4 shows a block diagram of an AR4A encoder performing the above described process steps. An input message 10 comprises 2T input symbols $s_0$ and $s_1$.

Symbols $s_0$ are multiplied by a circulant matrix $H_1$. Symbols $s_1$ are multiplied by matrix $H_2$. The results are summed, producing the T untransmitted parity symbols, denoted $p_0$, corresponding to the fifth column of H. The untransmitted parity symbols $p_0$ are then multiplied by matrix $H_3$ (upper right branch of FIG. 4) and matrix $H_4$ (lower right branch of FIG. 4). The matrix multiplication in the lower right branch of FIG. 4 computes the T parity symbols denoted $p_1$, corresponding to the third column of H. The matrix multiply, permute (element 20), and accumulate (elements 31, 32) steps in the upper right branch of FIG. 4 compute T more parity symbols $p_2$. Concatenating with the input message 10 gives the systematic output codeword 40.

Figure 3:
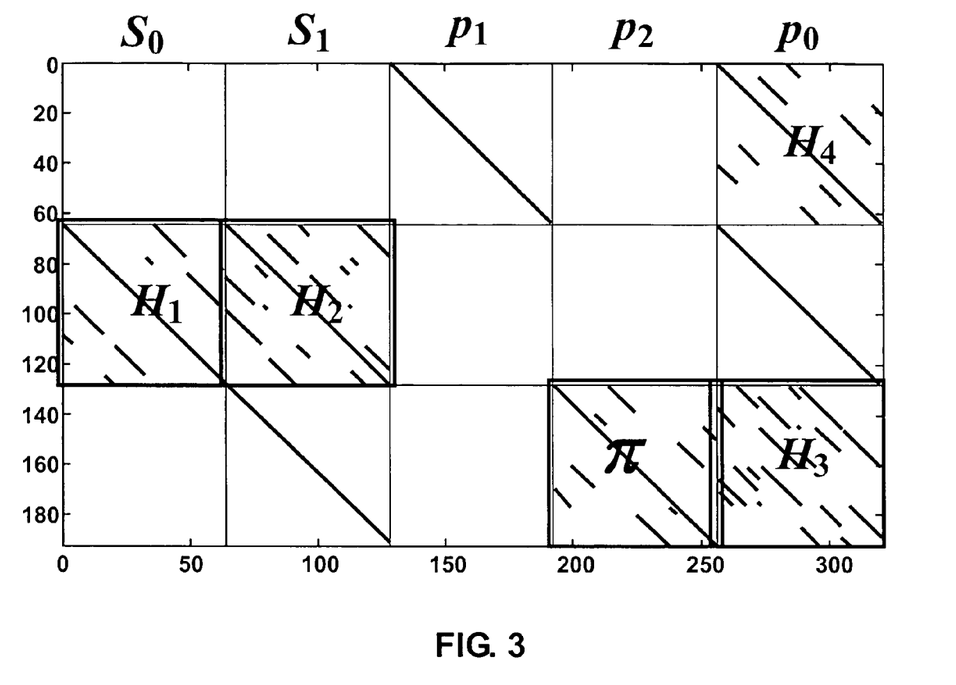
FIG. 3 shows a parity check matrix for an AR4A code.

As shown in FIG. 3, each row and each column of matrices $H_1$ and $H_4$ have Hamming weight 2, and each row and each column of matrices $H_2$ and $H_3$ have Hamming weight 3; these Hamming weights match the corresponding entries in the AR4A base matrix.

2B. Iterative Encoder for AR3A Code

The AR3A code shows somewhat different behavior. With the same row and column ordering, the AR3A base matrix is $$H = \begin{bmatrix} 2 & 2 & 1 & 0 & 0 \\ 0 & 1 & 2 & 1 & 0 \\ 0 & 1 & 2 & 0 & 2 \end{bmatrix}$$

Foreseeing the problematic 2 in the lower right corner, one redundant check equation can be constructed by summing the last T rows of H to get the length N+P=5T vector, $h=[0_T 1_T 0_T 0_T 0_T]$, where $0_T$ and $1_T$ represent strings of T zeros and T ones, respectively. This check equation shows that the first 2T variable nodes are not linearly independent, and cannot all be assigned information bits. Instead, information bits are assigned to the first 2T−1 and to the very last variable node. Iterative encoding begins with the constructed check equation h, which computes the 2T'th code symbol as the parity of the preceding T−1 symbols. Iterative encoding then proceeds to completion exactly as for the AR4A code.

The iterative encoding algorithm will be described pictorially for a variation of the AR3A code. In the AR3A code of FIG. 1, variable node 4 is connected by two edges to check node B, and variable node 5 is also doubly connected to check node C. A very similar protograph can be constructed by crossing two of these edges, so nodes 4 and 5 are each singly connected to both B and C. When the columns are placed in order (1, 4, 5, 3, 2) and rows in order (A, B, C), the protograph is expanded first by a factor of 8, and then a second time with circulants of size 64×64, the result is the parity check matrix shown in FIG. 5. Key blocks are colored and labeled. By summing the bottom 2T=2M rows of the parity-check matrix in FIG. 5, we note that the 2T=2M code symbols $s_0$, $s_1$ corresponding to the rightmost 2T=2M columns must have overall even parity. The encoder for this variation of the AR3A code assigns k−1=2T−1 input message bits to the first 2T−1 positions of $s_0$, $s_1$, and computes the T-th bit of $s_1$ as the parity of these 2T−1 message bits. The 2T-th message bit is used to initialize the state of the accumulator in FIG. 6.

Figure 5:
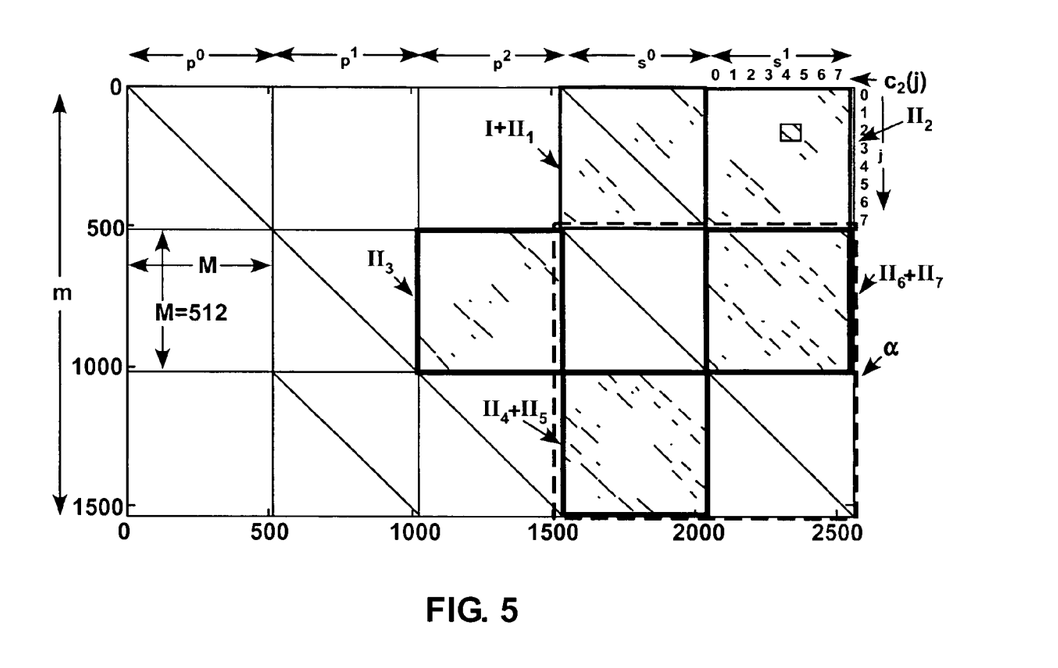
FIG. 5 shows a parity check matrix for an AR3A code.
Figure 6:
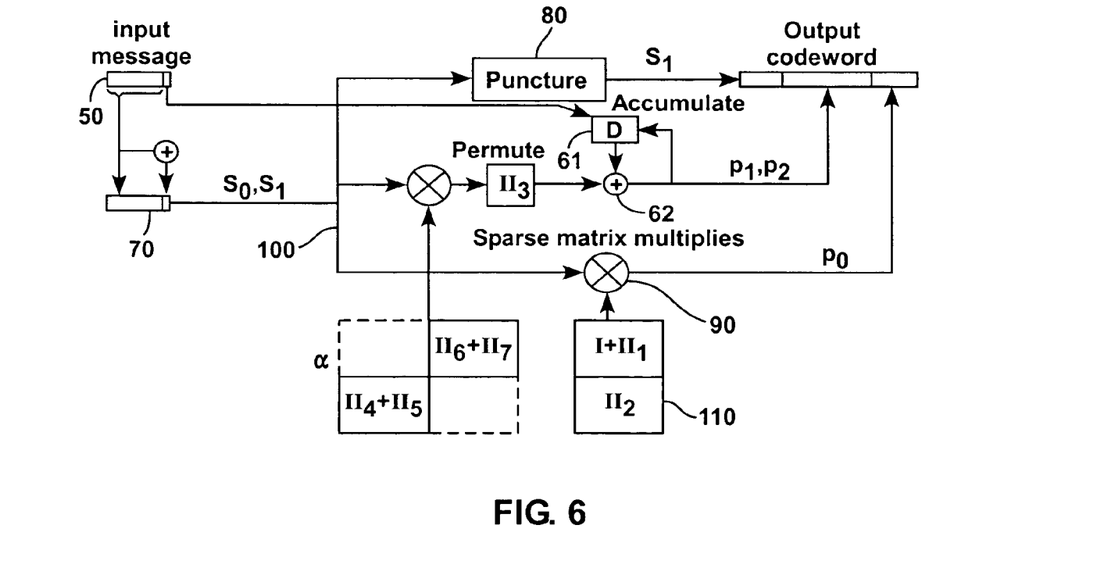
FIG. 6 shows a block diagram of an AR3A encoder.

FIG. 6 shows the corresponding encoder architecture, where matrices $\Pi1$, $\Pi2$, $\Pi3$, $\cup4+\Pi5$, and $\Pi6+\Pi7$ correspond to those in FIG. 5. I and $\Pi1$ through $\Pi7$ are permutation matrices, so each row and each column of these matrices has Hamming weight 1. The matrices are chosen so that the sums I+$\Pi1$, $\Pi4+\Pi5$, and $\Pi6+\Pi7$ consist entirely of rows and columns of weight 2. In FIG. 6, the last message bit of input message 50 is replaced by the parity of the remaining message bits, and the discarded bit is used instead to initialize the accumulator 61, 62. On the top horizontal path through FIG. 6, the puncture box 80 passes half of the k=2T bits $s_0$, $s_1$ to serve as k/2−1 systematic symbols in the codeword. In other words, puncture box 80 discards $s_0$ and passes only $s_1$.

On the bottom horizontal path, a sparse matrix multiply 90 is performed between the vector 100 of k message bits and a k×k/2 sparse matrix 110 comprised of matrices $\Pi1$ and $\Pi2$ of FIG. 5, to generate another k/2 codeword symbols $p_0$. On the middle path, the k message bits 100 are multiplied by the sparse k×k matrix α of FIG. 5. The resulting k bits are re-ordered in a manner determined by $\Pi3$ (see also FIG. 5), and then accumulated into a running sequence of outputs from an exclusive-OR gate. This forms the remaining k codeword symbols $p_1$, $p_2$.

Very similar algorithms are possible whenever the protograph can be lower triangularized as shown for the AR3A and AR4A codes, and the main diagonal consists exclusively of the numbers 1 and 2. Iterative encoders of this nature are not always possible. The AR34JA protograph (described later) cannot be lower-triangularized, and so iterative encoders of this style do not exist. Instead, the encoders described in the next section can be used.

3. Encoders Using Block-Circulant Generator Matrices

In the present section, the construction of systematic block-circulant generator matrices will be presented.

The LDPC codes discussed here are defined by a block matrix H composed of circulants, and of size rT×nT, where r<n. A quasicyclic code is one for which a "quasicyclic shift" of a codeword is also a codeword. That is, if any codeword c is partitioned into binary strings of length T and each string is circularly shifted by the same amount, the resulting vector is also a codeword. It is immediate that any LDPC code defined by a block-circulant H matrix is quasicyclic.

In some cases, such a code has a systematic generator matrix G of size (n−r)T×nT that is entirely composed of circulants. To construct such a generator matrix, the columns of H are sorted so that the kT symbols desired to be systematic appear first, followed by the remaining rT parity symbols. That is, let H=[Q S], where Q is of size rT×kT, and S is square and of size rT×rT. In general, if S is not full rank, then G cannot be quasicyclic. Otherwise, G is computed as $$G = [I_{(n-r)T} (WQ)^T]$$

where $I_{(n-r)T}$ is the identity matrix of size (n−r)T×(n−r)T. Not all block-circulant LDPC codes have block-circulant generator matrices. As a particularly small example, suppose H is described by the single circulant with the first row [1 1 0 1 0 0 0], and size 7×7. As noted above, this only has rank 4. One codeword is [1 1 1 0 1 0 0], and because the code is quasicyclic (in fact cyclic, because H consists of a single circulant), all cyclic shifts of this codeword are also codewords. However, the circulant with the first row [1 1 1 0 1 0 0] only has rank 3, and so cannot be used in its entirety as a generator matrix.

In the remainder of this section, reference will be made again to the AR3A and AR4A codes discussed earlier.

3A. Generator Matrix for AR3A

The 3T×5T parity check matrix for AR3A is full rank, and so a generator matrix for this code will have dimension 2T. The matrix H is partitioned into [Q S], where Q contains the columns to make systematic, and S is the square matrix of parity symbols that must be invertible. If Q is chosen to include the circulants corresponding to variable nodes 4 and 2 in the protograph, as done for the iterative encoder, it can be found that S has rank rT−1, deficient by 1. This misfortune occurs because of the closed loop of degree-2 variable nodes created by protograph nodes 5 and C.

Figure 7:
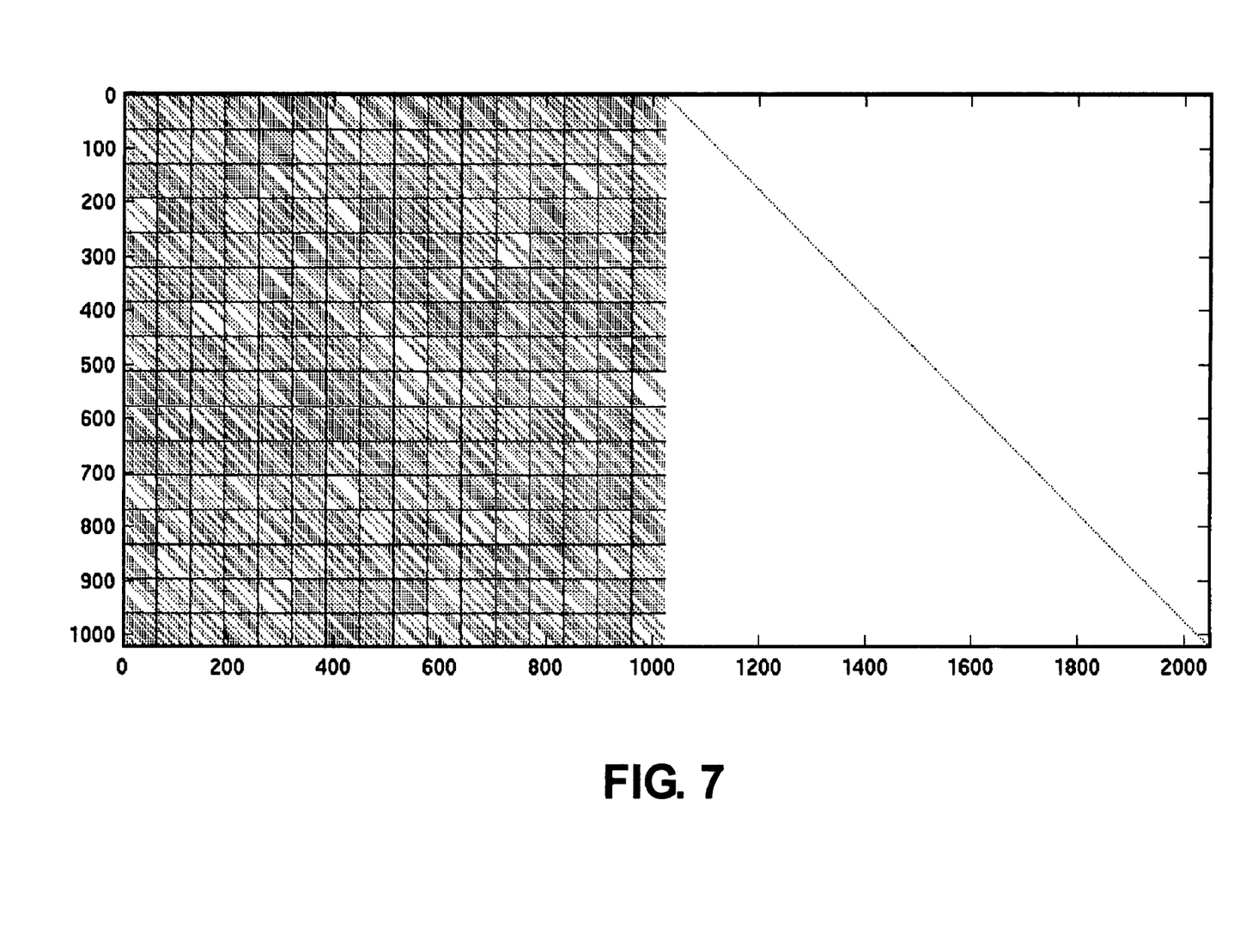
FIG. 7 shows a systematic block-circulant generator matrix for the AR3A code.

Alternatively, one can choose to make protograph variable nodes 4 and 5 systematic. In this case, S has full rank, and a systematic block-circulant G can be calculated exactly as described. When this is done for the parity check matrix in FIG. 5, the result is the generator matrix shown in FIG. 7. An encoder that performs matrix multiplication by G is particularly suitable for hardware implementation as described in the next section.

3B. Generator Matrix for AR4A

Figure 8:
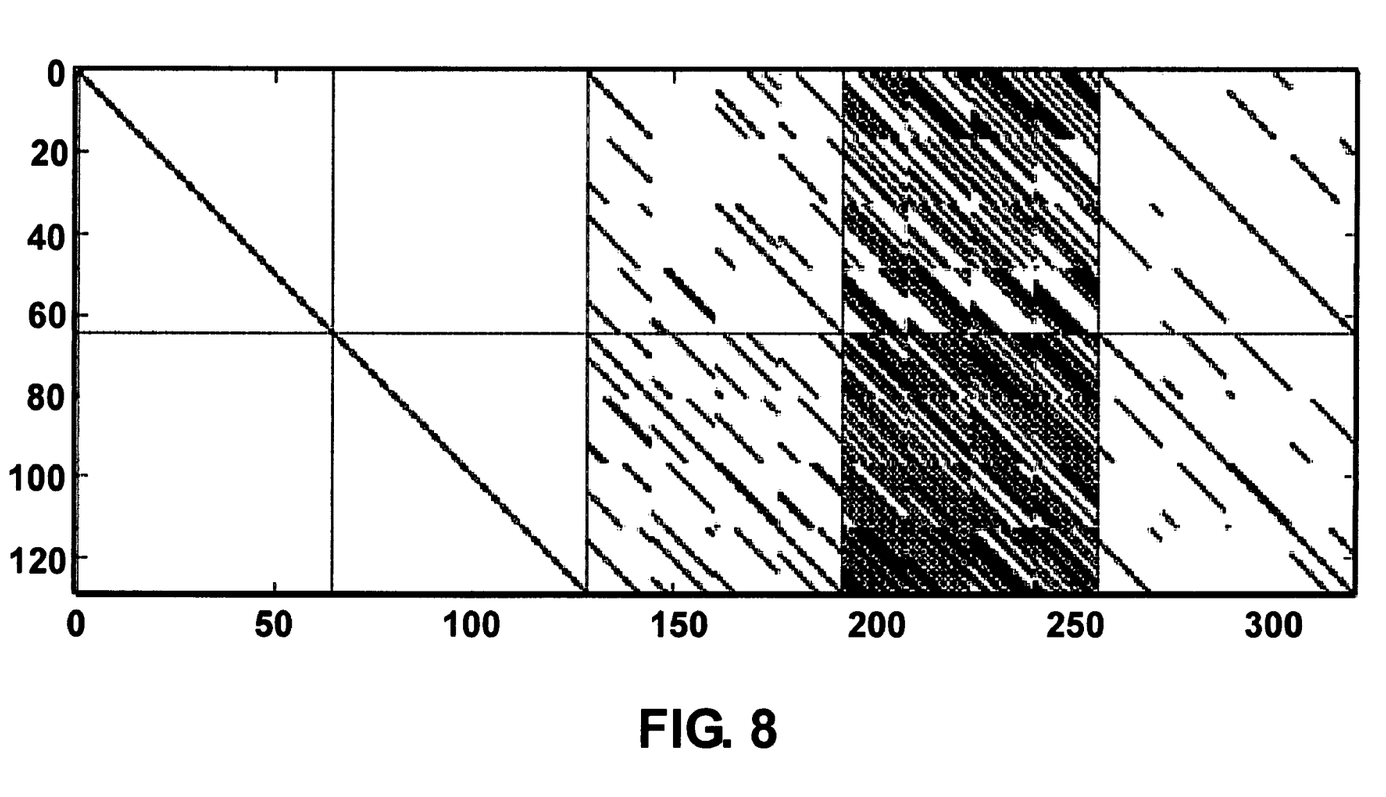
FIG. 8 shows a systematic block-circulant generator matrix for the AR4A code.

The AR4A code will be now taken into consideration. For this code, there is no set of R columns that can be selected from H to form an invertible square matrix S, because H itself is rank deficient by 1. Remarkably, these two defects cancel and the method for constructing G can proceed with minor modifications. Variable nodes 4 and 2 are selected to be systematic, and when H is arranged to put these on the left, it appears as shown in FIG. 3. The left two fifths of H is the matrix Q, and the remaining square portion on the right is S. The equations are solved to find codewords of the form $c_4 = [1\ 0_{2T-1}\ p^1\ p^5\ p^3]$, and of the form $c_2 = [0_T\ 1\ 0_{T-1}\ p^1\ p^5\ p^3]$, where $0_i$ is a string of i zeros, and each $p^x$ is a binary string of length T. By expanding these solutions into circulants, a block-circulant "generator" matrix can be formed, $$G = \begin{bmatrix} C_4 \\ C_2 \end{bmatrix}$$

of size 2T×5T. This is one dimension short, and the missing codeword is $c = [0_{3T}\ 1_T\ 0_T]$. Note that if c were expanded into circulants, the resulting T×nT matrix has rank 1. For implementation, it is preferable to use this G as the generator matrix and discard the one additional dimension in the code, accepting the miniscule performance loss. The generator matrix G, corresponding to the parity check matrix of FIG. 3, is shown in FIG. 8. Because the last T code symbols are punctured, the rightmost columns of circulants would be deleted from G in implementation. By design, the first two columns of circulants form an identity matrix; the remaining circulants could have been dense by the construction algorithm, but the AR4A protograph structure assures that many remain sparse.

3C. Generator Matrix for AR34JA

A third example is the AR34JA codes, built from the protograph, $$H = \begin{bmatrix} 0 & 0 & 0 & 1 & 2 \\ 2 & 2 & 1 & 0 & 1 \\ 1 & 1 & 1 & 0 & 2 \end{bmatrix}$$

These codes do not have an iterative encoder of the form described earlier, because H cannot be lower triangularized. However, quasicyclic encoders do exist. It is not hard to show that the two columns of H chosen for systematic symbols must be one of the first two (identical) columns, and either the third or the fifth column. For these choices, a quasicyclic encoder can be constructed in the usual way, just as for the AR3A code described earlier. Any other choice fails to yield a quasicyclic encoder, because it results in a rank-deficient sub-matrix S that cannot be inverted.

4. Software Implementation

The iterative encoders described so far can often be implemented efficiently in software. This is because the computations can be performed in parallel, operating on T symbols at a time. Moreover, the use of circulants means that the required reordering of symbols is typically minimal, unlike the situation with more general permutations. Preliminary results from a software implementation of this algorithm finds that it runs at 90 Kbps/MHz for several rate 1/2 AR3A codes. In particular, the software encoder runs at 128 Mbits/sec on a 1.42 GHz Macintosh, and can be expected to run at something like 1.8 Mbits/sec on a 20 MHz RAD6000 spaceflight qualified microprocessor.

5. Hardware Implementation

Figure 9:
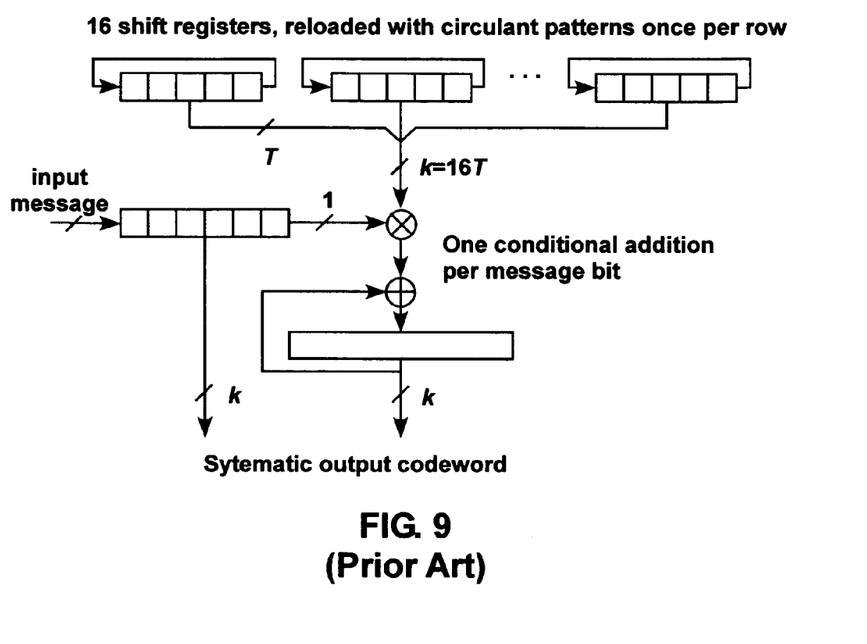
FIG. 9 shows a hardware implementation of a quasicyclic encoder.

The systematic block-circulant generator matrices developed in the previous sections are particularly amenable to hardware implementation. A hardware encoder can pass the kT message bits to the output as code symbols, while internally performing a multiplication by the (dense) k×(n−k) matrix in the right hand portion of G. The resulting vector serves as the remaining (n−k)T code symbols. A direct implementation of this dense matrix multiplication is shown in FIG. 9, as proposed in S. Lin, "Quasi-Cyclic LDPC Codes," CCSDS working group white paper, October 2003. The set of n−k cyclic shift registers at the top of the figure, each of length T, are loaded with the circulant patterns for the first row of G. For each message bit $m_i$ in turn, these registers are cycled once and, if $m_i$=1, exclusive-ORed with the n−k symbol output register. When each row of circulants is completed, sequences for the next row of circulants in G are loaded into the shift registers.

Figure 10:
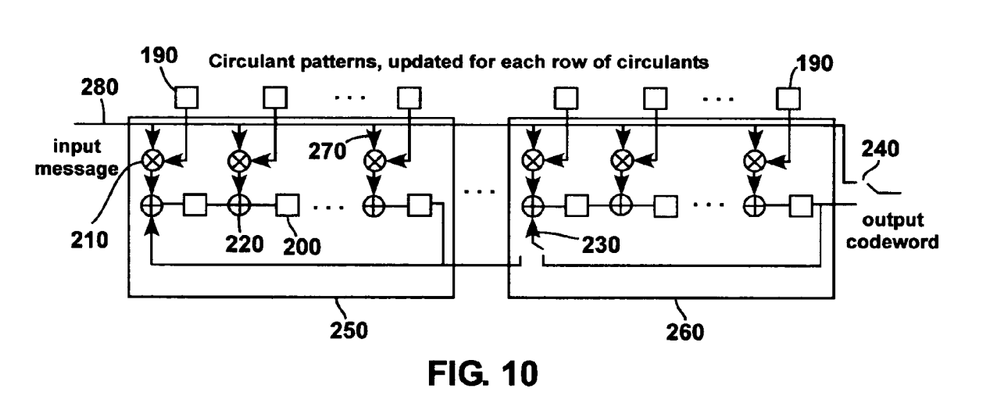
FIG. 10 shows a hardware implementation of a quasicyclic encoder using feedback shift registers.

In accordance with the present disclosure, an improvement in the hardware encoder is to cyclicly shift the output register, rather than the circulant registers, as shown in FIG. 10.

The hardware encoder of FIG. 10 comprises one-bit storage units 200 shown as squares, one-bit multipliers (logical AND gates) 210 shown as circled crosses, one-bit adders (logical Exclusive OR gates) 220 shown as circled plusses, and switches 230, 240. Many of these are organized into structures 250, 260 known as Recursive Convolutional Encoders (RCEs), as shown. For a block-circulant generator matrix G of size kT×nT, this encoder comprises primarily n−k RCEs, each of length T.

The encoder is initialized by setting all the storage units 200 within the RCEs to zero, and setting the n−k switches 230 as shown in the figure. Setting of the switches 230 as shown in FIG. 10 allows the contents of the last storage unit of each RCE to be fed back to the first adder of that RCE. Then encoding is performed in a bit-serial fashion, T bits at a time. Before encoding the first T bits, each RCE is provided with a binary sequence of length T via the incoming arrows shown 270 along its top edge 280. This binary sequence could be computed and placed in the collection of (n−k)T storage units 190 shown by the row of boxes across the top of FIG. 10. Alternatively, the binary sequence could be provided directly by combinatorial logic driven by a message bit counter. These binary sequences describe the circulants of the generator matrix, and so are called circulant patterns. The first set of circulant patterns used is given by the first row of the generator matrix G, and it is stored from right to left in the boxes 190 across the top of FIG. 10.

The first T message bits are encoded sequentially as follows. The first bit is sent directly to the output as the first codeword symbol. Simultaneously, the sequence stored in each RCE 250, 260 is either Exclusive ORed with the corresponding circulant pattern (if the message bit is a 1) or taken unmodified (if the message bit is a 0), and is right circularly shifted one position. Then the second bit is encoded the same way: it is taken as the second codeword symbol, and simultaneously determines whether the circulant patterns are Exclusive ORed with the contents of each RCE, before the next right circular shift. This process is repeated until T message bits have been encoded.

Before encoding the next T message bits, a new set of circulant patterns are computed and provided to the RCEs. Then message bits T+1 through 2T are encoded by conditional Exclusive OR operations and right circular shifts. These steps are repeated until all kT message bits have been encoded.

To complete generating the codeword, all n−k switches are changed to the opposite position from that shown, and all circulant patterns are set to zero. The contents of the n−k RCEs are then sequentially read out via right shifts as the parity portion of the codeword.

In other words, when the output switch 240 is set as drawn in FIG. 10, all kT input message bits go straight through the RCEs unchanged, and serve as output codeword symbols. Simultaneously, each message bit is multiplied by a circulant pattern, and the result is added to the shifted register contents. Then, the switch 240 is flipped and (because the other (n−k−1) switches 230 are flipped too) the daisy-chain of all (n−k)T registers in the RCEs are read out sequentially. The result is a codeword of length nT, of which the first kT symbols are just a copy of the input message (i.e. the encoder of FIG. 10 is a systematic encoder).

For each set of T message bits input through the input line, the circulant pattern is generally different for each of the RCEs. For example, FIG. 8 shows the block-circulant generator matrix for an AR4A code. The first 128 columns of the matrix of FIG. 8 just have a diagonal line: this is an identity matrix that passes the input bits to the output unchanged. The remaining 192 columns comprise an 8×12 array of circulants, each of size T=16. Except for the occasional coincidence, all 96 circulants are different.

This encoder has been implemented in hardware. It requires n−k D-latches, n−k exclusive-OR gates, and a modest amount of additional combinatorial logic. The size (k=1024, n=2048) LDPC code fits comfortably in a Xilinx XC3S200 Spartan Field Programmable Gate Array (FPGA), and runs at 100 Msymbols/second. Speed is determined by the maximum clock rate of the FPGA. The maximum supported code size is determined primarily by the number of D-latches required to accumulate the parity, and so scales linearly with n−k.

5. Conclusion

As many research groups have discovered in the last couple years, block-circulant LDPC codes have well structured decoders, and offer excellent error correction performance when designed carefully. The Applicants have shown in the present disclosure that block-circulant LDPC codes possess attractive encoders as well, of a couple different forms.

An iterative encoder is often possible for block-circulant LDPC codes, based on the standard erasure correction algorithm. Due to the circulant structure of the parity check matrix, the computational steps are typically sparse matrix multiplication by a circulant, permutation, and modulo-2 accumulation. The circulant matrix multiplications operate on long strings of sequential bits, so parallel computations are practical and permit fast encoders.

Encoders composed of linear feedback shift registers are another attractive alternative for block-circulant LDPC codes. These are based on the block-circulant generator matrices that these LDPC codes often possess. Such an encoder requires remarkably little hardware, and provides a fast, simple, bit-serial architecture. The Applicants have implemented these decoders in a small FPGA operating at 100 Msymbols/second.

The encoders and encoding methods disclosed herein are applicable to a wide range of communication problems. They would be of interest to any application that requires the excellent performance that LDPC codes provide, and that would benefit from low-complexity LDPC encoders. Examples include communications systems onboard spacecraft in deep space or in orbit around the earth, digital encoders in cellular telephones, encoders within data storage devices such as hard disk drives and magnetic tape recorders, and encoders within computer modems.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. An encoding apparatus to encode message input symbols in accordance with an accumulate-repeat-accumulate code with repetition four, the apparatus comprising:
    a first multiplier to multiply a first portion of the input symbols with a first matrix, forming first intermediate symbols;
    a second multiplier to multiply a second portion of the input symbols with a second matrix, forming second intermediate symbols;
    a first adder to sum the first intermediate symbols with the second intermediate symbols, forming third intermediate symbols;
    a third multiplier to multiply the third intermediate symbols with a third matrix, forming fourth intermediate symbols;
    a fourth multiplier to multiply the third intermediate symbols with a fourth matrix, forming a first set of output symbols;
    a second adder to sum the fourth intermediate symbols with the second portion of the input symbols, forming fifth intermediate symbols;
    a permuter to permute the fifth intermediate symbols, forming permuted symbols; and
    an accumulator to accumulate the permuted symbols, forming a second set of output symbols.

2. The apparatus of claim 1, wherein the first portion of the input symbols corresponds to a first half of the input symbols and the second portion of the input symbols corresponds to a second half of the input symbols.

3. The apparatus of claim 1, wherein output symbols are obtained by combining the first set of output symbols, the second set of output symbols, and the input symbols.

4. The apparatus of claim 1, wherein each row of the first matrix has Hamming weight 2, each row of the second matrix has Hamming weight 3, each row of the third matrix has Hamming weight 3, and each row of the fourth matrix has Hamming weight 2.

5. The apparatus of claim 1, wherein the first matrix, second matrix, third matrix and fourth matrix are block-circulant matrices.

6. A method for encoding message input symbols in accordance with an accumulate-repeat-accumulate code with repetition four, comprising:
    multiplying a first portion of the input symbols with a first matrix, forming first intermediate symbols;
    multiplying a second portion of the input symbols with a second matrix, forming second intermediate symbols;
    adding the first intermediate symbols to the second intermediate symbols, forming third intermediate symbols;
    multiplying the third intermediate symbols with a third matrix, forming fourth intermediate symbols;
    multiplying the third intermediate symbols with a fourth matrix, forming a first set of output symbols;
    adding the fourth intermediate symbols with the input symbols, forming fifth intermediate symbols;
    permuting the fifth intermediate symbols, forming permuted symbols; and
    accumulating the permuted symbols, forming a second set of output symbols.

7. The method of claim 6, wherein output symbols are obtained by combining the first set of output symbols, the second set of output symbols, and the input symbols.

8. The method of claim 6, wherein the first portion of the input symbols corresponds to a first half of the input symbols and the second portion of the input symbols corresponds to a second half of the input symbols.

9. The method of claim 6, wherein each row of the first matrix has Hamming weight 2, each row of the second matrix has Hamming weight 3, each row of the third matrix has Hamming weight 3, and each row of the fourth matrix has Hamming weight 2.

10. The method of claim 6, wherein the first matrix, second matrix, third matrix and fourth matrix are block-circulant matrices.

11. An encoding apparatus to encode message input symbols in accordance with an accumulate-repeat-accumulate code with repetition three, the apparatus comprising:
    a puncturing device, puncturing k input symbols and outputting k/2 input symbols, forming a first set of output symbols;
    a first multiplier to multiply the k input symbols with a first matrix, forming first intermediate symbols;
    a second multiplier to multiply the k input symbols with a second matrix, forming a second set of output symbols;
    a permuter to permute the first intermediate symbols, forming permuted symbols; and
    an accumulator to accumulate the permuted symbols, forming a third set of output symbols.

12. The apparatus of claim 11, wherein an output codeword is obtained by combining the first, second and third sets of output symbols.

13. The apparatus of claim 11, wherein the first matrix is a block matrix of size k×k, comprising two on-diagonal sub-matrices each of size k/2 ×k/2 and two off-diagonal sub-matrices each of size k/2 ×k/2, and the second matrix is of size k×k/2, k being an integer.

14. The apparatus of claim 13, wherein the two on-diagonal sub-matrices are zero and the two off-diagonal sub-matrices each have rows of Hamming weight 2, and the second matrix has k/2 rows with Hamming weight 1 and k/2 rows with Hamming weight 2.

15. The apparatus of claim 11, wherein the first matrix and the second matrix are block-circulant matrices.

16. A method for encoding message input symbols in accordance with an accumulate-repeat-accumulate code with repetition three, comprising:
puncturing k input symbols and outputting k/2 input symbols, forming a first set of output symbols, k being an integer;
multiplying the k input symbols with a first matrix, forming first intermediate symbols;
multiplying the k input symbols with a second matrix, forming a second set of output symbols;
permuting the first intermediate symbols, forming permuted symbols; and
accumulating the permuted symbols, forming a third set of output symbols.

17. The method of claim 16, further comprising combining the first, second and third sets of output symbols to obtain an output codeword.

18. The method of claim 16, wherein the first matrix is a block matrix of size k×k, comprising two on-diagonal sub-matrices each of size k/2 ×k/2 and two off-diagonal sub-matrices each of size k/2 ×k/2, and the second matrix is of size k×k/2.

19. The method of claim 18, wherein the two on-diagonal sub-matrices are zero and the two off-diagonal sub-matrices each have rows of Hamming weight 2, and the second matrix has k/2 rows with Hamming weight 1 and k/2 rows with Hamming weight 2.

20. The method of claim 16, wherein the first and second matrix are block-circulant matrices.

21. An encoding apparatus to encode input symbols in accordance with a block-circulant low density parity check (LDPC) code, the apparatus comprising:
a plurality of recursive convolutional encoders, each recursive convolutional encoder comprising storage units, multipliers and adders to encode the input symbols; and
a plurality of circulant patterns to be fed to the recursive convolutional encoders, one set of patterns for each recursive convolutional encoder.

22. The apparatus of claim 21, wherein the recursive encoders further comprise switches, each switch having a first condition where contents of a rightmost storage unit of a recursive convolutional encoder are sent back to that recursive convolutional encoder and a second condition where contents of a rightmost storage unit are sent towards the output.

23. The apparatus of claim 21, wherein output symbols are obtained by combining the input symbols with the contents of the storage units within the recursive convolutional encoders.

24. A method for encoding input symbols in accordance with a block-circulant LDPC code, comprising:
providing a plurality of recursive convolutional encoders, each recursive convolutional encoder comprising storage units, multipliers and adders;
setting the storage units to a first binary value;
repeating the following operations:
i) computing a set of circulant patterns,
ii) providing each recursive convolutional encoder with a binary sequence of T message bits, each message bit sent to the output as a codeword symbol, and each message bit being multiplied with a circulant pattern, summed to the result of a previous multiplication, stored in a storage unit and shifted, until the T message bits have been encoded,
until kT message bits have been encoded; and
generating an output codeword by reading the contents of the storage units of the recursive convolutional encoders,
wherein k and T are integers.

25. The method of claim 24, wherein the binary sequences are provided through an additional plurality of storage units.

26. The method of claim 24, wherein the binary sequences are provided by combinatorial logic.

27. The method of claim 24, wherein the binary sequences correspond to circulant patterns of a generator matrix.

28. The method of claim 24, wherein the plurality of recursive convolutional encoders comprises n-k convolutional encoders, n being an integer, wherein n-k-1 recursive convolutional encoders comprise a switch, the switch having a first condition where the contents of the rightmost storage unit of a recursive convolutional encoder are sent to the leftmost adder of that recursive convolutional encoder, and a second condition where the contents of the rightmost storage unit of a recursive convolutional encoder are sent towards the output.

* * * * *